(12) United States Patent
Cowell et al.

(10) Patent No.: US 7,356,737 B2
(45) Date of Patent: Apr. 8, 2008

(54) SYSTEM, METHOD AND STORAGE MEDIUM FOR TESTING A MEMORY MODULE

(75) Inventors: Thomas M. Cowell, Poughkeepsie, NY (US); Frank D. Ferriaolo, New Windsor, NY (US); Kevin C. Gower, LaGrangeville, NY (US); Frank LaPietra, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 652 days.

(21) Appl. No.: 10/977,922

(22) Filed: Oct. 29, 2004

(65) Prior Publication Data

US 2006/0117233 A1     Jun. 1, 2006

(51) Int. Cl.
*G06F 11/00* (2006.01)

(52) U.S. Cl. .................................. 714/42; 714/718
(58) Field of Classification Search .................. 714/42, 714/5, 29, 54, 718

See application file for complete search history.

(56) References Cited

U.S. PATENT DOCUMENTS

| | | | |
|---|---|---|---|
| 3,825,904 A | 7/1974 | Burk et al. | |
| 4,028,675 A | 6/1977 | Frankenberg | 711/106 |
| 4,135,240 A | 1/1979 | Ritchie | |
| 4,475,194 A | 10/1984 | LaVallee et al. | 371/10 |
| 4,486,739 A | 12/1984 | Franaszek et al. | 340/347 DD |
| 4,654,857 A | 3/1987 | Samson et al. | |
| 4,723,120 A | 2/1988 | Petty, Jr. | 340/825.02 |
| 4,740,916 A | 4/1988 | Martin | 364/900 |
| 4,796,231 A | 1/1989 | Pinkham | 385/189.05 |
| 4,803,485 A | 2/1989 | Rypinski | 370/452 |

(Continued)

FOREIGN PATENT DOCUMENTS

GB     2396711 A     6/2004

(Continued)

OTHER PUBLICATIONS

Sivencrona et al.; "RedCAN™: Simulations of two Fault Recovery Algorithms for CAN;" Proceedings for the 10th IEEE Pacific International Symposium on Dependable Computing (PRDC'04); 2005.

(Continued)

*Primary Examiner*—Dieu-Minh Le
(74) *Attorney, Agent, or Firm*—Cantor Colburn LLP; Lynn Augspurger

(57) ABSTRACT

A buffered memory module including a downstream buffer, a downstream receiver, an upstream driver, an upstream receiver. The downstream buffer and the downstream receiver are both adapted for connection to a downstream memory bus in a packetized cascaded interconnect memory subsystem. The upstream driver and the upstream receiver are both adapted for connection to an upstream memory bus in the memory subsystem. During a test of the memory module, the upstream driver is connected to the downstream receiver and the downstream driver is connected to the upstream receiver. The memory module also includes one or more storage registers, a microprocessor and a service interface port. The microprocessor includes instructions for executing the test of the memory module including storing results of the test in the storage registers. The service interface port receives service interface signals that initiate the execution of the test and accesses the storage registers to determine the results of the test.

10 Claims, 11 Drawing Sheets

U.S. PATENT DOCUMENTS

| | | | |
|---|---|---|---|
| 4,833,605 A | 5/1989 | Terada et al. ............... 364/200 |
| 4,839,534 A | 6/1989 | Clasen ...................... 307/269 |
| 4,943,984 A | 7/1990 | Pechanek et al. ........... 375/109 |
| 4,985,828 A | 1/1991 | Shimizu et al. |
| 5,053,947 A | 10/1991 | Heibel et al. ............... 364/200 |
| 5,177,375 A | 1/1993 | Ogawa et al. |
| 5,206,946 A | 4/1993 | Brunk ......................... 710/2 |
| 5,214,747 A | 5/1993 | Cok ........................... 395/27 |
| 5,265,049 A | 11/1993 | Takasugi |
| 5,265,212 A | 11/1993 | Bruce, II .................... 710/113 |
| 5,287,531 A | 2/1994 | Rogers, Jr. et al. ......... 395/800 |
| 5,347,270 A | 9/1994 | Matsuda et al. ........... 340/2.21 |
| 5,387,911 A | 2/1995 | Gleichert et al. ............ 341/95 |
| 5,394,535 A | 2/1995 | Ohuchi ...................... 711/155 |
| 5,454,091 A | 9/1995 | Sites et al. |
| 5,475,690 A | 12/1995 | Burns et al. ............. 370/105.3 |
| 5,513,135 A | 4/1996 | Dell et al. .................... 365/52 |
| 5,544,309 A | 8/1996 | Chang et al. |
| 5,592,632 A | 1/1997 | Leung et al. ............... 395/306 |
| 5,611,055 A | 3/1997 | Krishan et al. ............. 395/281 |
| 5,613,077 A | 3/1997 | Leung et al. ............... 395/306 |
| 5,627,963 A | 5/1997 | Gabillard et al. ............. 714/42 |
| 5,629,685 A | 5/1997 | Allen et al. ............. 340/825.02 |
| 5,661,677 A | 8/1997 | Rondeau, II et al. |
| 5,666,480 A | 9/1997 | Leung et al. ............... 395/180 |
| 5,764,155 A | 6/1998 | Kertesz et al. ......... 340/825.08 |
| 5,822,749 A | 10/1998 | Agarwal |
| 5,852,617 A | 12/1998 | Mote, Jr. .................... 714/726 |
| 5,870,325 A | 2/1999 | Nielsen et al. ................ 365/63 |
| 5,872,996 A | 2/1999 | Barth et al. ................. 395/853 |
| 5,926,838 A | 7/1999 | Jeddeloh .................... 711/167 |
| 5,928,343 A | 7/1999 | Farmwald et al. .......... 710/104 |
| 5,930,273 A | 7/1999 | Mukojima .................. 714/776 |
| 5,973,591 A | 10/1999 | Schwartz et al. ............. 365/52 |
| 5,974,493 A | 10/1999 | Okumura et al. ........... 710/307 |
| 5,995,405 A | 11/1999 | Trick ........................... 365/63 |
| 6,038,132 A | 3/2000 | Tokunaga et al. ........... 361/760 |
| 6,049,476 A | 4/2000 | Laudon et al. ................ 365/52 |
| 6,076,158 A | 6/2000 | Sites et al. |
| 6,078,515 A | 6/2000 | Nielsen et al. ................ 365/63 |
| 6,096,091 A | 8/2000 | Hartmann .................... 716/17 |
| 6,128,746 A | 10/2000 | Clark et al. ................. 713/324 |
| 6,170,047 B1 | 1/2001 | Dye |
| 6,170,059 B1 | 1/2001 | Pruett et al. |
| 6,173,382 B1 | 1/2001 | Dell et al. ................... 711/170 |
| 6,215,686 B1 | 4/2001 | Deneroff et al. .............. 365/52 |
| 6,219,288 B1 | 4/2001 | Braceras et al. |
| 6,260,127 B1 | 7/2001 | Olarig et al. ................. 711/167 |
| 6,262,493 B1 | 7/2001 | Garnett |
| 6,292,903 B1 | 9/2001 | Coteus et al. ............... 713/401 |
| 6,301,636 B1 | 10/2001 | Schultz et al. .............. 711/108 |
| 6,317,352 B1 | 11/2001 | Halbert et al. ................ 365/52 |
| 6,321,343 B1 | 11/2001 | Toda ........................... 713/600 |
| 6,338,113 B1 | 1/2002 | Kubo et al. ................. 711/105 |
| 6,370,631 B1 | 4/2002 | Dye |
| 6,378,018 B1 | 4/2002 | Tsern et al. ................. 710/129 |
| 6,381,685 B2 | 4/2002 | Dell et al. |
| 6,393,528 B1 | 5/2002 | Arimilli et al. |
| 6,473,836 B1 | 10/2002 | Ikeda |
| 6,477,614 B1 | 11/2002 | Leddige et al. |
| 6,483,755 B2 | 11/2002 | Leung et al. .......... 365/189.05 |
| 6,484,271 B1 | 11/2002 | Gray |
| 6,487,627 B1 | 11/2002 | Willke et al. ............... 710/306 |
| 6,493,250 B2 | 12/2002 | Halbert et al. ................ 365/63 |
| 6,496,540 B1 | 12/2002 | Windmer .................... 375/242 |
| 6,496,910 B1 | 12/2002 | Baentsch et al. |
| 6,499,070 B1 | 12/2002 | Whetsel |
| 6,502,161 B1 | 12/2002 | Perego et al. .................. 711/5 |
| 6,507,888 B2 | 1/2003 | Wu et al. .................... 711/105 |
| 6,510,100 B2 | 1/2003 | Grundon et al. ............ 365/233 |
| 6,513,091 B1 | 1/2003 | Blackmon et al. .......... 710/316 |
| 6,526,469 B1 | 2/2003 | Drehmel et al. ............. 710/306 |
| 6,532,525 B1 | 3/2003 | Aleksic et al. .............. 711/168 |
| 6,546,359 B1 | 4/2003 | Week ......................... 702/186 |
| 6,549,971 B1 | 4/2003 | Cecchi et al. ............... 710/306 |
| 6,553,450 B1 | 4/2003 | Dodd et al. ................. 711/105 |
| 6,557,069 B1 | 4/2003 | Drehmel et al. ............. 710/307 |
| 6,564,329 B1 | 5/2003 | Cheung et al. |
| 6,587,112 B1 | 7/2003 | Goeltzenleuchter et al. |
| 6,587,912 B2 | 7/2003 | Leddige |
| 6,601,121 B2 | 7/2003 | Singh et al. ................. 710/112 |
| 6,611,905 B1 | 8/2003 | Grundon et al. ............ 711/167 |
| 6,622,217 B2 | 9/2003 | Gharachorloo et al. ..... 711/141 |
| 6,625,687 B1 | 9/2003 | Halbert et al. .............. 711/105 |
| 6,625,702 B2 | 9/2003 | Rentschler et al. |
| 6,628,538 B2 | 9/2003 | Funaba et al. ................. 365/63 |
| 6,631,439 B2 | 10/2003 | Saulsbury et al. |
| 6,671,376 B1 | 12/2003 | Koto et al. .................. 380/210 |
| 6,678,811 B2 | 1/2004 | Rentschler et al. ......... 711/167 |
| 6,697,919 B2 | 2/2004 | Gharachorloo et al. ..... 711/141 |
| 6,704,842 B1 | 3/2004 | Janakiraman et al. |
| 6,721,944 B2 | 4/2004 | Chaudhry et al. |
| 6,738,836 B1 | 5/2004 | Kessler et al. |
| 6,741,096 B2 | 5/2004 | Moss |
| 6,766,389 B2 | 7/2004 | Hayter et al. |
| 6,775,747 B2 | 8/2004 | Venkatraman |
| 6,791,555 B1 | 9/2004 | Radke et al. |
| 6,839,393 B1 | 1/2005 | Sidiropoulos ............... 375/371 |
| 6,877,076 B1 | 4/2005 | Cho et al. |
| 6,877,078 B2 | 4/2005 | Fujiwara et al. |
| 6,889,284 B1 | 5/2005 | Nizar et al. |
| 6,938,119 B2 | 8/2005 | Kohn et al. |
| 6,949,950 B2 | 9/2005 | Takahashi et al. |
| 6,977,536 B2 | 12/2005 | Chin-Chich et al. ........ 327/116 |
| 7,133,972 B2 | 11/2006 | Jeddeloh |
| 7,162,567 B2 * | 1/2007 | Jeddeloh ........................ 711/5 |
| 7,177,211 B2 | 2/2007 | Zimmerman |
| 7,206,962 B2 | 4/2007 | Deegan |
| 2001/0000822 A1 | 5/2001 | Dell et al. ................... 711/170 |
| 2001/0003839 A1 | 6/2001 | Kondo |
| 2002/0019926 A1 | 2/2002 | Huppenthal et al. .......... 712/15 |
| 2002/0038405 A1 | 3/2002 | Leddige et al. |
| 2002/0083255 A1 | 6/2002 | Greeff et al. ................ 710/305 |
| 2002/0103988 A1 | 8/2002 | Domier |
| 2002/0112119 A1 | 8/2002 | Halbert et al. |
| 2002/0112194 A1 | 8/2002 | Uzelac ....................... 713/500 |
| 2002/0124195 A1 | 9/2002 | Nizar |
| 2002/0147898 A1 | 10/2002 | Rentschler et al. |
| 2002/0174274 A1 | 11/2002 | Wu et al. |
| 2003/0033364 A1 | 2/2003 | Garnett et al. .............. 709/203 |
| 2003/0056183 A1 | 3/2003 | Kobayahi |
| 2003/0084309 A1 | 5/2003 | Kohn ......................... 713/189 |
| 2003/0090879 A1 | 5/2003 | Doblar et al. ................ 361/728 |
| 2003/0126363 A1 | 7/2003 | David |
| 2003/0223303 A1 | 12/2003 | Lamb et al. ........... 365/230.06 |
| 2003/0236959 A1 | 12/2003 | Johnson et al. ............. 711/167 |
| 2004/0006674 A1 | 1/2004 | Hargis et al. ................ 711/156 |
| 2004/0049723 A1 | 3/2004 | Obara ........................ 714/729 |
| 2004/0098549 A1 | 5/2004 | Dorst |
| 2004/0117588 A1 | 6/2004 | Arimilli et al. |
| 2004/0128474 A1 | 7/2004 | Vorbach ....................... 712/10 |
| 2004/0163028 A1 | 8/2004 | Olarig |
| 2004/0205433 A1 | 10/2004 | Gower et al. |
| 2004/0230718 A1 | 11/2004 | Polzin et al. |
| 2004/0246767 A1 | 12/2004 | Vogt ........................... 365/154 |
| 2004/0250153 A1 | 12/2004 | Vogt ........................... 713/500 |
| 2004/0260909 A1 | 12/2004 | Lee et al. |
| 2004/0260957 A1 | 12/2004 | Jeddeloh et al. |
| 2005/0023560 A1 | 2/2005 | Ahn et al. ................... 257/200 |
| 2005/0044457 A1 | 2/2005 | Jeddeloh |
| 2005/0050237 A1 | 3/2005 | Jeddeloh |
| 2005/0050255 A1 | 3/2005 | Jeddeloh |
| 2005/0066136 A1 | 3/2005 | Schnepper |
| 2005/0080581 A1 | 4/2005 | Zimmerman et al. |

| | | |
|---|---|---|
| 2005/0097249 A1 | 5/2005 | Oberlin et al. |
| 2005/0120157 A1 | 6/2005 | Chen et al. ............... 710/313 |
| 2005/0125702 A1 | 6/2005 | Huang et al. |
| 2005/0125703 A1 | 6/2005 | Lefurgy et al. |
| 2005/0138267 A1 | 6/2005 | Bains et al. |
| 2005/0144399 A1 | 6/2005 | Hosomi |
| 2005/0166006 A1 | 7/2005 | Talbot et al. |
| 2005/0177690 A1 | 8/2005 | LaBerge |
| 2005/0204216 A1 | 9/2005 | Daily et al. ............... 714/724 |
| 2005/0229132 A1 | 10/2005 | Butt et al. ............... 716/10 |
| 2005/0257005 A1 | 11/2005 | Jeddeloh |
| 2005/0259496 A1 | 11/2005 | Hsu et al. |
| 2006/0036826 A1 | 2/2006 | Dell et al. |
| 2006/0036827 A1 | 2/2006 | Dell et al. |
| 2006/0107175 A1 | 5/2006 | Dell et al. |

FOREIGN PATENT DOCUMENTS

| | | |
|---|---|---|
| JP | 04326140 A | 11/1992 |

OTHER PUBLICATIONS

Jungjoon Kim et al.; "Performance and Architecture Features of Segmented Multiple Bus System;" IEEE Computer Society; 1999 International Conference on Parallel Processing (ICPP '99).

Ghoneima et al.; "Optimum Positioning of Interleaved Reapeaters in Bidirectional Buses;" IEEE Transactions on Computer-Aided Design of Integrated Cirucits and Systems, vol. 25, No. 3, Mar. 2005, pp. 461-469.

Seceleanu et al.; "Segment Arbiter as Action System;" IEEE 2003 pp. 249-252.

Understanding System Memory and CPU Speeds: A Layman's Guide to the Front Side Bus (FSB), [online]; [retrieved on Feb. 23, 2006]; retrieved from the Internet http://www.directron.com/fsbguide.html.

JEDEC Solid State Technology Association, "JEDEC Standard: DDR2 SDRAM Specification", Jan. 2004, JEDEC, Revision JESD79-2A, p. 10.

NB940259 (IBM Technical Disclosure Bulletin, Feb. 1994; vol. 37; pp. 59-64).

Wikipedia, Serial Communications, [online], [retrieved Apr. 10, 2007 from the Internet], http://en.wikipedia.org/wiki/Serial_communications, 3 pages.

Brown, et al "Compiler-Based I/O Prefetching for Out-of-Core Applications", ACM Transactions on Computer Systems, vol. 19, No. 2, May 2001, pp. 111-170.

Wang, et al "Guided Region Prefetching: A Cooperative Hardware/Software Approach", pp. 388-398; Jun. 9, 2003.

Natarajan, et al "A Study of Performance Impact of Memory Controller Features in Multi-Processor Server Environment", pp. 80-87, 2004.

Nilsen, "High-Level Dynamic Memory Management for Object-Oriented Real-Time Systems", pp. 86-93; Jan. 1, 1996.

IEEE, "IEEE Standard Test Access Port and Boundary-Scan Architecture", Jul. 23, 2001, IEEE Std 1149-1-2001, pp. 11-13.

Rosenberg, "Dictionary of Computers, Information Processing & Telecommuications", Second Edition, John Wiley & Sons, Inc. 1987. 3 pgs.

Benini, Luca, et al. "System-Level Power Optimization: Techniques and Tools", ACM Transactions on Design Automation of Electronic Systems, vol. 6, No. 2, Apr. 2001, pp. 149-206.

Boudon, et al., "Novel Bus Reconfiguration Scheme With Spare Lines", IBM Technical Disclosure Bulletin, May 1987, vol. 29, No. 12, pp. 1-3.

Massoud Pedram, "Power Minimization in IC Design Principles and Applications", ACM Transactions on Design Automation of Electronic Systems vol. 1, No. 1, Jan. 1996, pp. 3-56.

P.R. Panda, "Data and Memory Optimization Techniques For Embedded Systems", ACM Transactions on Design Automation of Electronic Systems, vol. 6, No. 2, Apr. 2001, pp. 149-206.

Penrod, Lee, "Understanding System Memory and CPU Speeds: A laymans guide to the Front Side Bus (FSB)", Dec. 28, 2005, Direction . Org, pp. 1-5, http://www.directron.com/directron/fsbguide.html.

Singh, S., et al., "Bus Sparing for Fault-Tolerant System Design" IBM Technical Disclosure Bulletin, Dec. 1991, vol. 34, No. 71, pp. 117-118.

U.S. Appl. No. 11/419,586, filed May 22, 2006. Robert Tremaine. "Systems and Methods for Providing Remote Pre-Fetch Buffers".

* cited by examiner

SYSTEM, METHOD AND STORAGE MEDIUM FOR TESTING A MEMORY MODULE

BACKGROUND OF THE INVENTION

The invention relates to a memory subsystem and in particular, to testing high speed interfaces on a memory module.

Computer memory subsystems have evolved over the years, but continue to retain many consistent attributes. Computer memory subsystems from the early 1980's, such as the one disclosed in U.S. Pat. No. 4,475,194 to LaVallee et al., of common assignment herewith, included a memory controller, a memory assembly (contemporarily called a basic storage module (BSM) by the inventors) with array devices, buffers, terminators and ancillary timing and control functions, as well as several point-to-point busses to permit each memory assembly to communicate with the memory controller via its own point-to-point address and data bus. FIG. 1 depicts an example of this early 1980 computer memory subsystem with two BSMs, a memory controller, a maintenance console, and point-to-point address and data busses connecting the BSMs and the memory controller.

FIG. 2, from U.S. Pat. No. 5,513,135 to Dell et al., of common assignment herewith, depicts an early synchronous memory module, which includes synchronous dynamic random access memories (DRAMs) 8, buffer devices 12, an optimized pinout, an interconnect and a capacitive decoupling method to facilitate operation. The patent also describes the use of clock re-drive on the module, using such devices as phase lock loops (PLLs).

FIG. 3, from U.S. Pat. No. 6,510,100 to Grundon et al., of common assignment herewith, depicts a simplified diagram and description of a memory system 10 that includes up to four registered dual inline memory modules (DIMMs) 40 on a traditional multi-drop stub bus channel. The subsystem includes a memory controller 20, an external clock buffer 30, registered DIMMs 40, an address bus 50, a control bus 60 and a data bus 70 with terminators 95 on the address bus 50 and data bus 70.

FIG. 4 depicts a 1990's memory subsystem which evolved from the structure in FIG. 1 and includes a memory controller 402, one or more high speed point-to-point channels 404, each connected to a bus-to-bus converter chip 406, and each having a synchronous memory interface 408 that enables connection to one or more registered DIMMs 410. In this implementation, the high speed, point-to-point channel 404 operated at twice the DRAM data rate, allowing the bus-to-bus converter chip 406 to operate one or two registered DIMM memory channels at the full DRAM data rate. Each registered DIMM included a PLL, registers, DRAMs, an electrically erasable programmable read-only memory (EEPROM) and terminators, in addition to other passive components.

As shown in FIG. 5, memory subsystems were often constructed with a memory controller connected either to a single memory module, or to two or more memory modules interconnected on a 'stub' bus. FIG. 5 is a simplified example of a multi-drop stub bus memory structure, similar to the one shown in FIG. 3. This structure offers a reasonable tradeoff between cost, performance, reliability and upgrade capability, but has inherent limits on the number of modules that may be attached to the stub bus. The limit on the number of modules that may be attached to the stub bus is directly related to the data rate of the information transferred over the bus. As data rates increase, the number and length of the stubs must be reduced to ensure robust memory operation. Increasing the speed of the bus generally results in a reduction in modules on the bus, with the optimal electrical interface being one in which a single module is directly connected to a single controller, or a point-to-point interface with few, if any, stubs that will result in reflections and impedance discontinuities. As most memory modules are sixty-four or seventy-two bits in data width, this structure also requires a large number of pins to transfer address, command, and data. One hundred and twenty pins are identified in FIG. 5 as being a representative pincount.

FIG. 6, from U.S. Pat. No. 4,723,120 to Petty, of common assignment herewith, is related to the application of a daisy chain structure in a multipoint communication structure that would otherwise require multiple ports, each connected via point-to-point interfaces to separate devices. By adopting a daisy chain structure, the controlling station can be produced with fewer ports (or channels), and each device on the channel can utilize standard upstream and downstream protocols, independent of their location in the daisy chain structure.

FIG. 7 represents a daisy chained memory bus, implemented consistent with the teachings in U.S. Pat. No. 4,723,120. A memory controller 111 is connected to a memory bus 315, which further connects to a module 310a. The information on bus 315 is re-driven by the buffer on module 310a to the next module, 310b, which further re-drives the bus 315 to module positions denoted as 310n. Each module 310a includes a DRAM 311a and a buffer 320a. The bus 315 may be described as having a daisy chain structure, with each bus being point-to-point in nature.

With today's high speed digital links, adequate testing is required to determine that memory modules are shipped defect free and that they will meet the functional demands that are specified for the system application. Tests must be capable of identifying assembly defects, interconnect product defects, driver and receiver circuit defects, and defects which affect the functional protocol of the link. Defects that cause functional failure or erode performance to a state outside of the specified operating limits should be covered by the test. Historically, industry standard test equipment has been used to provide adequate test coverage. Such test equipment drives and receives signals, in accordance with the protocol of the memory product, at the specified timing and at the specified voltage amplitude. As the number of signals increases and as the speed of the memory products increases, a test system with enough signals to address the memory product under test and the speeds required to test may lead to a significant manufacturing cost. While a lower cost test system relying on direct current (DC) parameter measurement covers typical printed circuit board (PCB) and package assembly defects, it does not provide coverage for other kinds of possible defects. Defects manifesting as low value capacitive and resistive parasitic structures are not covered, nor is there an ability to generate or to evaluate the response of high speed switching signals.

An alternate method of testing high speed interfaces on memory modules is to use assembled or system boards to complete a full memory module test. This method is gaining favor, at least when associated with low cost systems, as normal production systems may be utilized as test platforms for module test. This solution is far from optimal due to several reasons, such as the lack of high insertion count module connectors, the lack of meaningful diagnostics (most modules are simply discarded if they fail), the short life expectancy of each test set up, and the need for unique test systems for each kind of memory module. For higher cost systems, this is not a workable solution for several reasons, such as the high initial investment, the space required, and the long boot-up times.

BRIEF SUMMARY OF THE INVENTION

Exemplary embodiments of the present invention include a buffered memory module with a downstream driver, a downstream receiver, an upstream driver, and an upstream receiver. The downstream driver and the downstream receiver are both adapted for connection to a downstream memory bus in a packetized cascaded interconnect memory subsystem. The upstream driver and the upstream receiver are both adapted for connection to an upstream memory bus in the memory subsystem. During a test of the memory module, the upstream driver is connected to the downstream receiver and the downstream driver is connected to the upstream receiver. The memory module also includes one or more storage registers, a microprocessor and a service interface port. The microprocessor includes instructions for executing the test of the memory module including storing results of the test in the storage registers. The service interface port receives service interface signals that initiate the execution of the test. Also the service interface port accesses the storage registers to determine the results of the test.

Additional exemplary embodiments include a method for testing a buffered memory module adapted for connection to a packetized cascaded interconnect memory subsystem. The method includes setting the memory module to a test mode. The setting includes connecting an upstream driver on the memory module to a downstream receiver on the memory module and connecting a downstream driver on the memory module to an upstream receiver on the memory module. A test is initiated on the memory module via a service interface signal, with input to the test including signals generated by the upstream driver and the downstream driver. Notification is received when the test has completed. The test results are determined based on information retrieved from storage registers on the memory module.

Further exemplary embodiments include a storage medium for testing a buffered memory module adapted for connection to a packetized cascaded interconnect memory subsystem. The storage medium is encoded with machine readable computer program code for causing a computer to implement a method. The method includes setting the memory module to a test mode. The setting includes connecting an upstream driver on the memory module to a downstream receiver on the memory module and connecting a downstream driver on the memory module to an upstream receiver on the memory module. A test is initiated on the memory module via a service interface signal, with input to the test including signals generated by the upstream driver and the downstream driver. Notification is received when the test has completed. The test results are determined based on information retrieved from storage registers on the memory module.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

Figure 1:
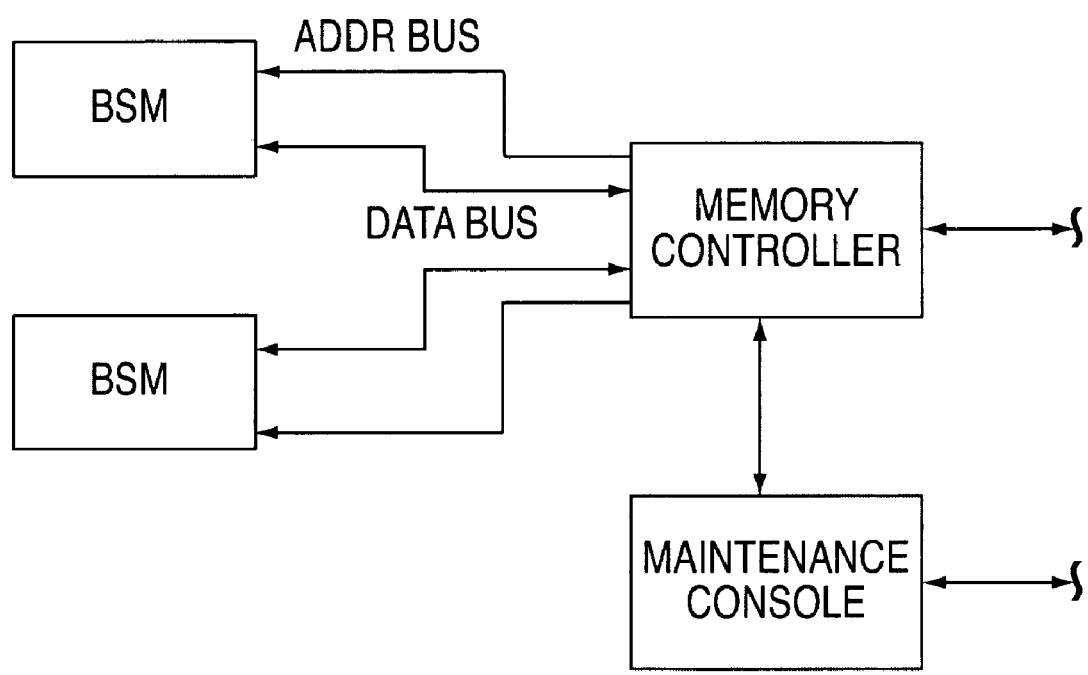
FIG. 1 depicts a prior art memory controller connected to two buffered memory assemblies via separate point-to-point links.
Figure 2:
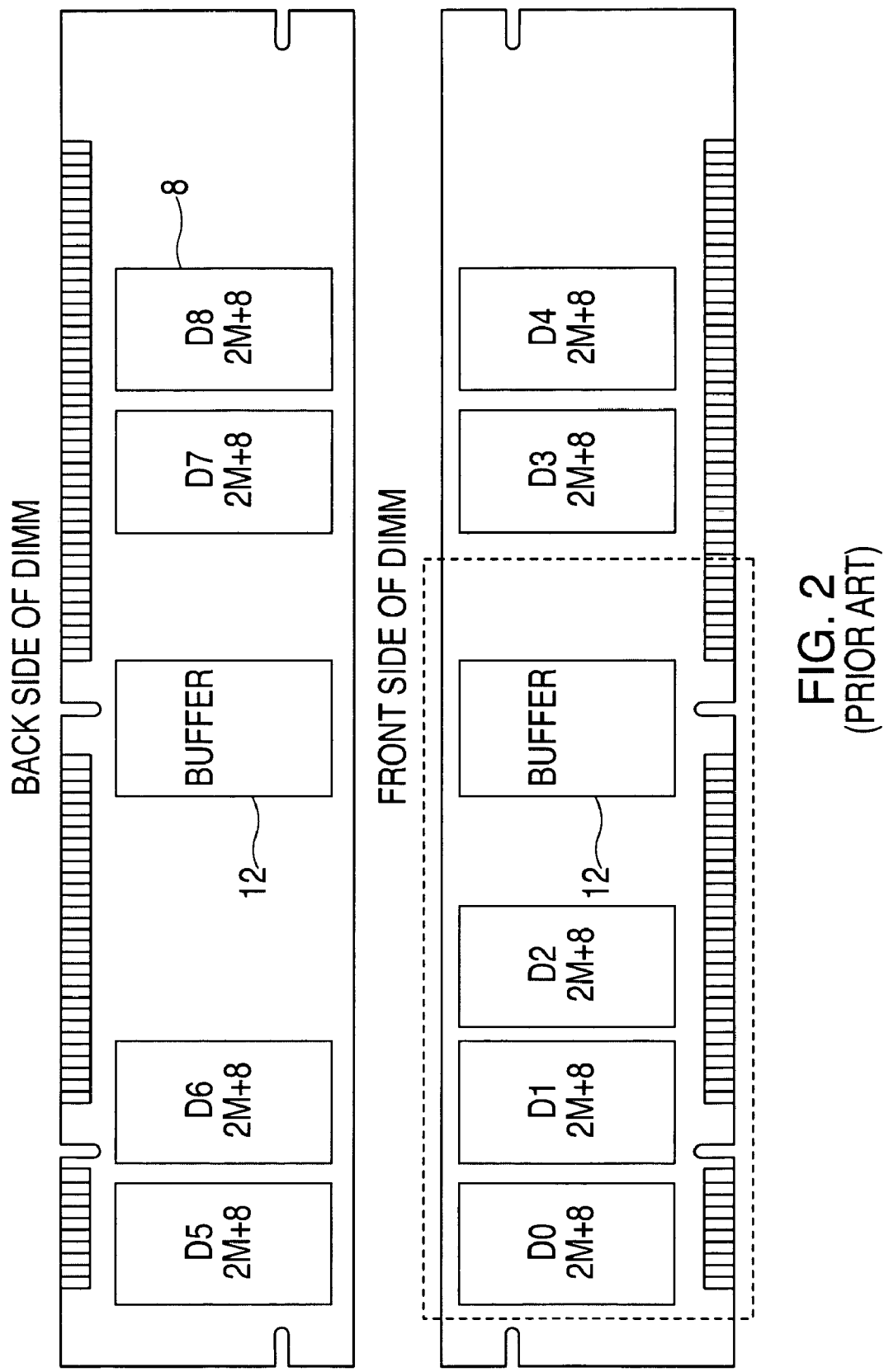
FIG. 2 depicts a prior art synchronous memory module with a buffer device.
Figure 3:
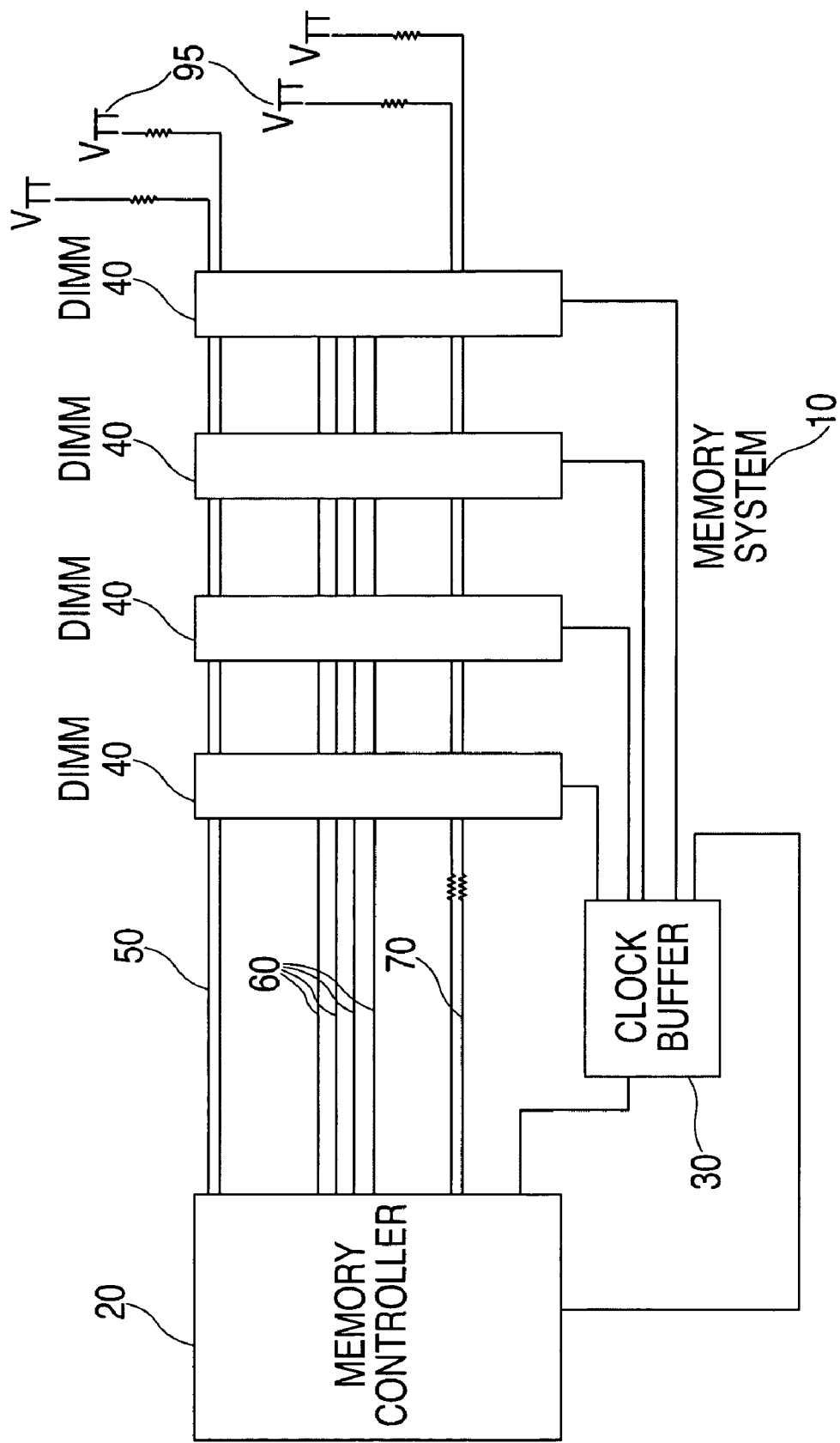
FIG. 3 depicts a prior art memory subsystem using registered DIMMs.

Exemplary embodiments of the present invention provide memory interface testing for high bandwidth/high speed memory modules. The memory modules described herein are intended for use in high performance and high density computer systems, storage systems, networks, and related products. The memory modules include multiple serialized interfaces for communicating with a processing element (e.g., a memory controller) and for communicating with additional memory modules connected in a cascaded manner. In general, conventional memory testers are not capable of achieving both the high data rates (e.g., initially up to 3.2 gigabytes per pin), and the required memory address/data patterns and refresh required to test high speed serialized interfaces located on high bandwidth/high speed memory modules.

Exemplary embodiments of the present invention utilize a high speed interface self-test mode which is implemented in the memory module, as well as an application process for performing the test. During memory module test, high speed signals are generated and wrapped back through test board connections to receivers on the memory module which respond to the signal transitions. The self test mode exercises the link, or serial interface, at a specified speed and with specified signal voltage levels, and permits the testing to be performed after the memory module is fully assembled. The entire signal path is exercised, including the driver and receiver circuitry, the solder interconnects, the module wiring, and other related circuitry. The cost of implementing the test is minimized because it consists of a basic off the shelf test system and a test adapter.

In an exemplary embodiment of the present invention, the testing is performed on (and by) a high speed and high reliability memory subsystem architecture and interconnect structure that includes single-ended point-to-point interconnections between any two subsystem components. The memory subsystem further includes a memory control function, one or more memory modules, one or more high speed busses operating at a four-to-one speed ratio relative to a DRAM data rate and a bus-to-bus converter chip on each of one or more cascaded modules to convert the high speed bus(ses) into the conventional double data rate (DDR) memory interface. The memory modules operate as slave devices to the memory controller, responding to commands in a deterministic or non-deterministic manner, but do not self-initiate unplanned bus activity, except in cases where operational errors are reported in a real-time manner. Memory modules can be added to the cascaded bus, with each module assigned an address to permit unique selection of each module on the cascaded bus. Exemplary embodiments of the present invention include a packetized multi-transfer interface which utilizes an innovative communication protocol to permit memory operation to occur on a reduced pincount, whereby address, command and data is transferred between the components on the cascaded bus over multiple cycles, and are reconstructed and errors corrected prior to being used by the intended recipient.

Figure 4:
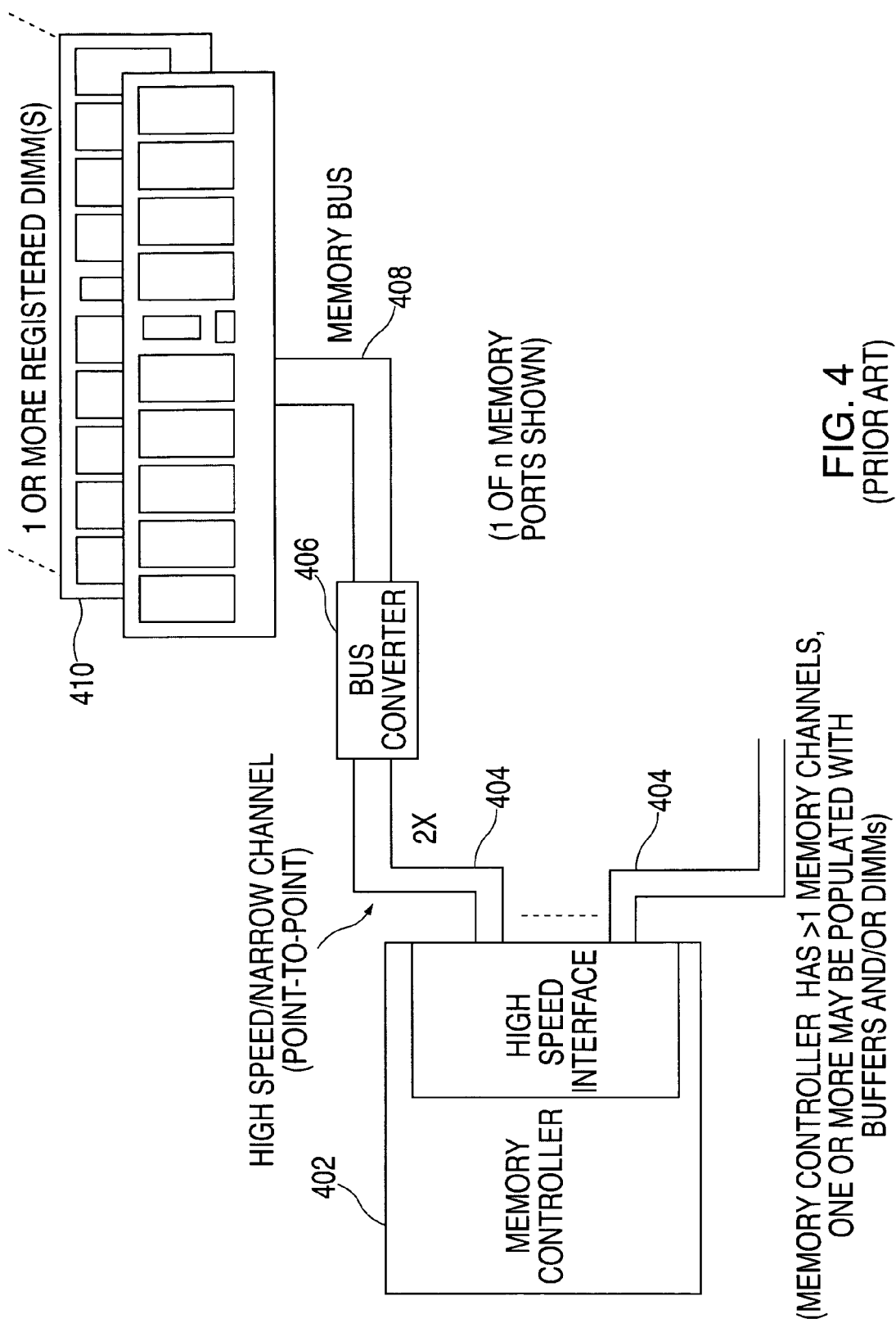
FIG. 4 depicts a prior art memory subsystem with point-to-point channels, registered DIMMs, and a 2:1 bus speed multiplier.
Figure 5:
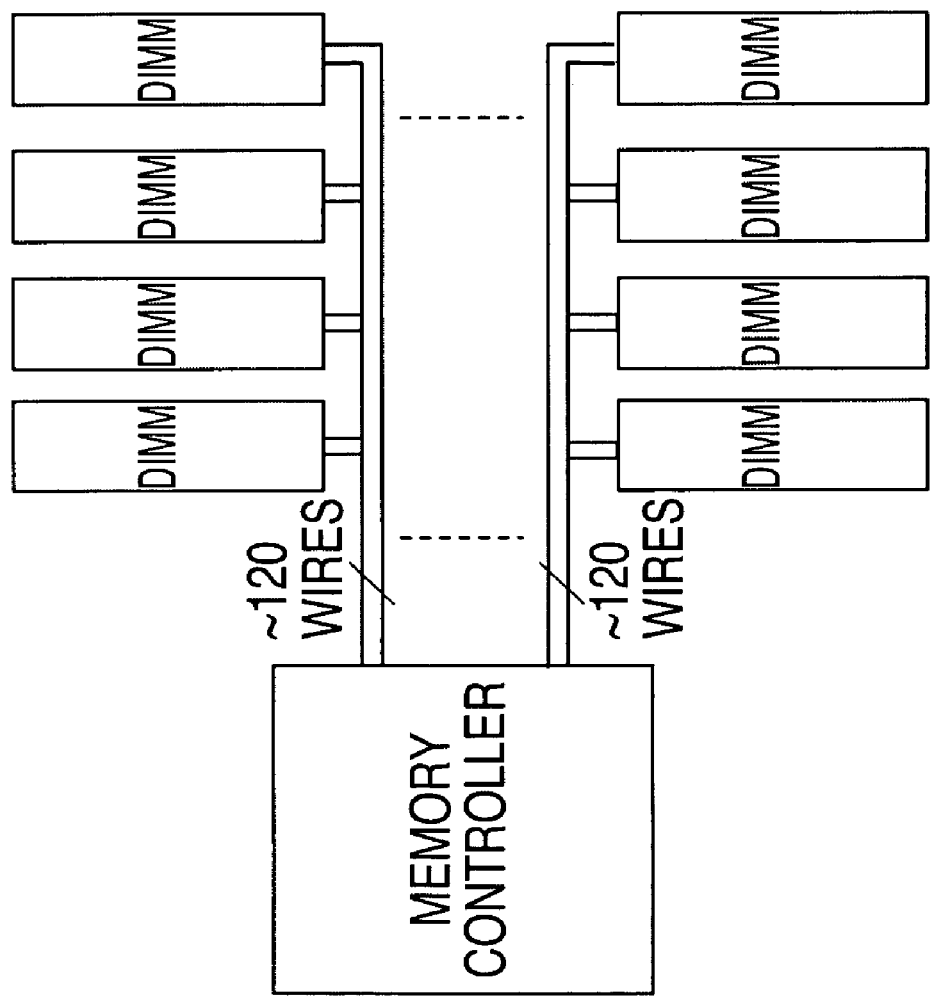
FIG. 5 depicts a prior art memory structure that utilizes a multidrop memory 'stub' bus.
Figure 6:
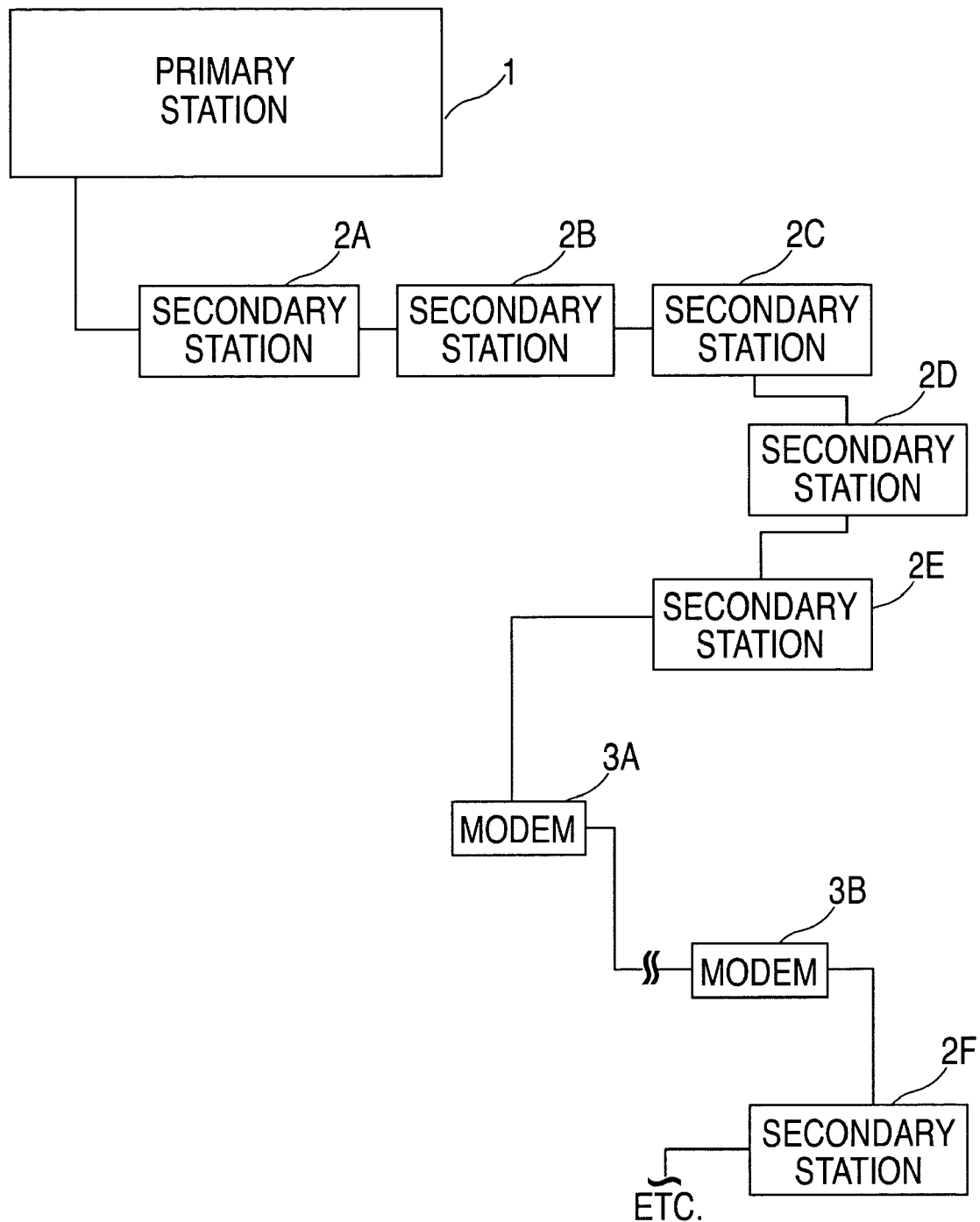
FIG. 6 depicts a prior art daisy chain structure in a multipoint communication structure that would otherwise require multiple ports.
Figure 7:
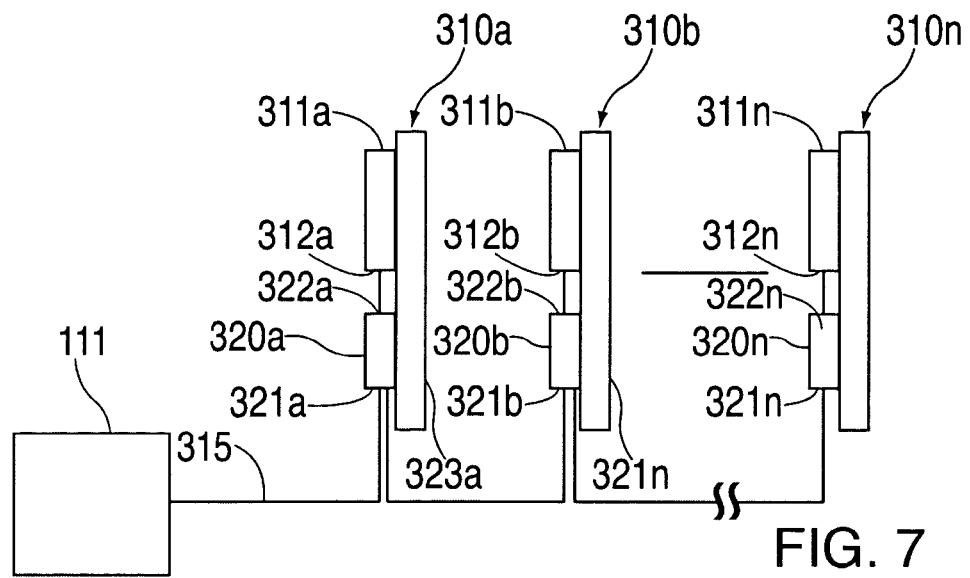
FIG. 7 depicts a prior art daisy chain connection between a memory controller and memory modules.
Figure 8:
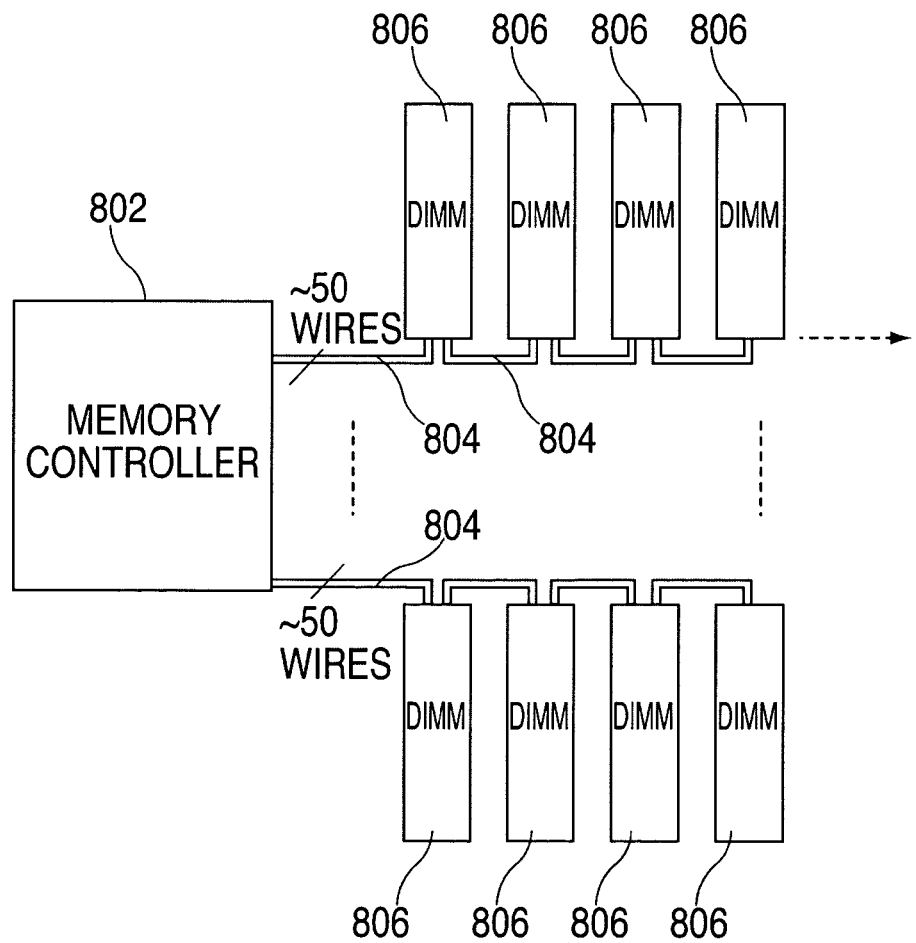
FIG. 8 depicts a cascaded memory structure that is utilized by exemplary embodiments of the present invention.

FIG. 8 depicts a cascaded memory structure that may be utilized by exemplary embodiments of the present invention when buffered memory modules 806 (e.g., the buffer device is included within the memory module 806) are in communication with a memory controller 802. This memory structure includes the memory controller 802 in communication with one or more memory modules 806 via a high speed point-to-point bus 804. Each bus 804 in the exemplary embodiment depicted in FIG. 8 includes approximately fifty high speed wires for the transfer of address, command, data and clocks. By using point-to-point busses as described in the aforementioned prior art, it is possible to optimize the bus design to permit significantly increased data rates, as well as to reduce the bus pincount by transferring data over multiple cycles. Whereas FIG. 4 depicts a memory subsystem with a two to one ratio between the data rate on any one of the busses connecting the memory controller to one of the bus converters (e.g., to 1,066 Mb/s per pin) versus any one of the busses between the bus converter and one or more memory modules (e.g., to 533 Mb/s per pin), an exemplary embodiment of the present invention, as depicted in FIG. 8, provides a four to one bus speed ratio to maximize bus efficiency and to minimize pincount.

Although point-to-point interconnects permit higher data rates, overall memory subsystem efficiency must be achieved by maintaining a reasonable number of memory modules 806 and memory devices per channel (historically four memory modules with four to thirty-six chips per memory module, but as high as eight memory modules per channel and as few as one memory module per channel). Using a point-to-point bus necessitates a bus re-drive function on each memory module. The bus re-drive function permits memory modules to be cascaded such that each memory module is interconnected to other memory modules as well as to the memory controller 802.

Figure 9:
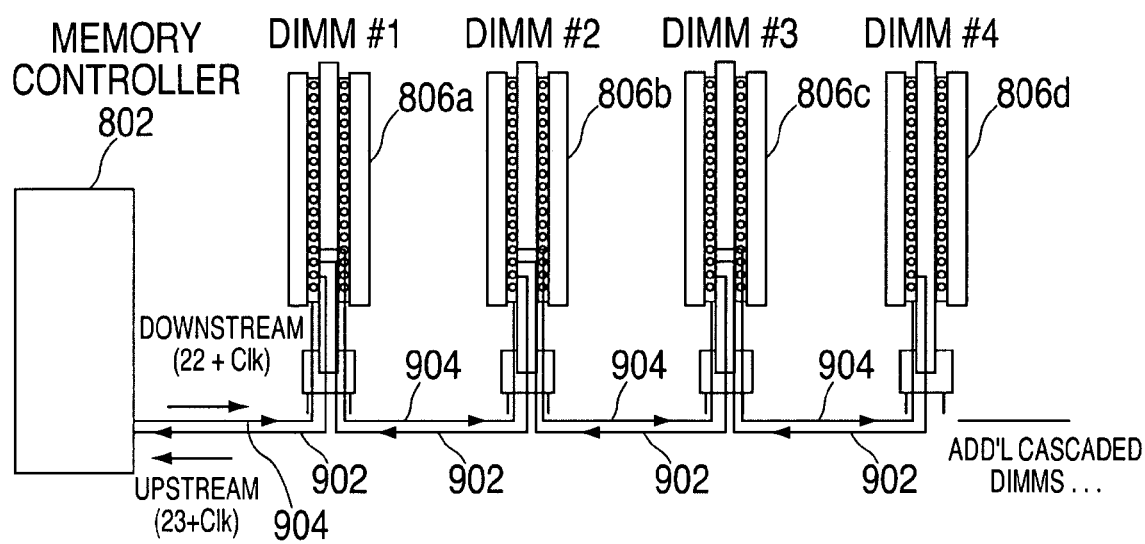
FIG. 9 depicts a memory structure with cascaded memory modules and unidirectional busses that is utilized by exemplary embodiments of the present invention.

FIG. 9 depicts a memory structure with cascaded memory modules and unidirectional busses that is utilized by exemplary embodiments of the present invention. One of the functions provided by the memory modules 806 in the cascade structure is a re-drive function to send signals on the memory bus to other memory modules 806 or to memory controller 802. FIG. 9 includes memory controller 802 and four memory modules 806a, 806b, 806c and 806d, on each of two memory busses (a downstream memory bus 904 and an upstream memory bus 902), connected to the memory controller 802 in either a direct or cascaded manner. Memory module 806a is connected to the memory controller 802 in a direct manner. Memory modules 806b, 806c and 806d are connected to the memory controller 802 in a cascaded manner.

An exemplary embodiment of the present invention includes two uni-directional busses between the memory controller 802 and memory module 806a ("DIMM #1"), as well as between each successive memory module 806b-d ("DIMM #2", "DIMM #3" and "DIMM #4") in the cascaded memory structure. The downstream memory bus 904 is comprised of twenty-two single-ended signals and a differential clock pair. The downstream memory bus 904 is used to transfer address, control, write data and bus-level error code correction (ECC) bits downstream from the memory controller 802, over several clock cycles, to one or more of the memory modules 806 installed on the cascaded memory channel. The upstream memory bus 902 is comprised of twenty-three single-ended signals and a differential clock pair, and is used to transfer read data and bus-level ECC bits upstream from the sourcing memory module 806 to the memory controller 802. Using this memory structure, and a four to one data rate multiplier between the DRAM data rate (e.g., 400 to 800 Mb/s per pin) and the unidirectional memory bus data rate (e.g., 1.6 to 3.2 Gb/s per pin), the memory controller 802 signal pincount, per memory channel, is reduced from approximately one hundred and twenty pins to about fifty pins.

Figure 10:
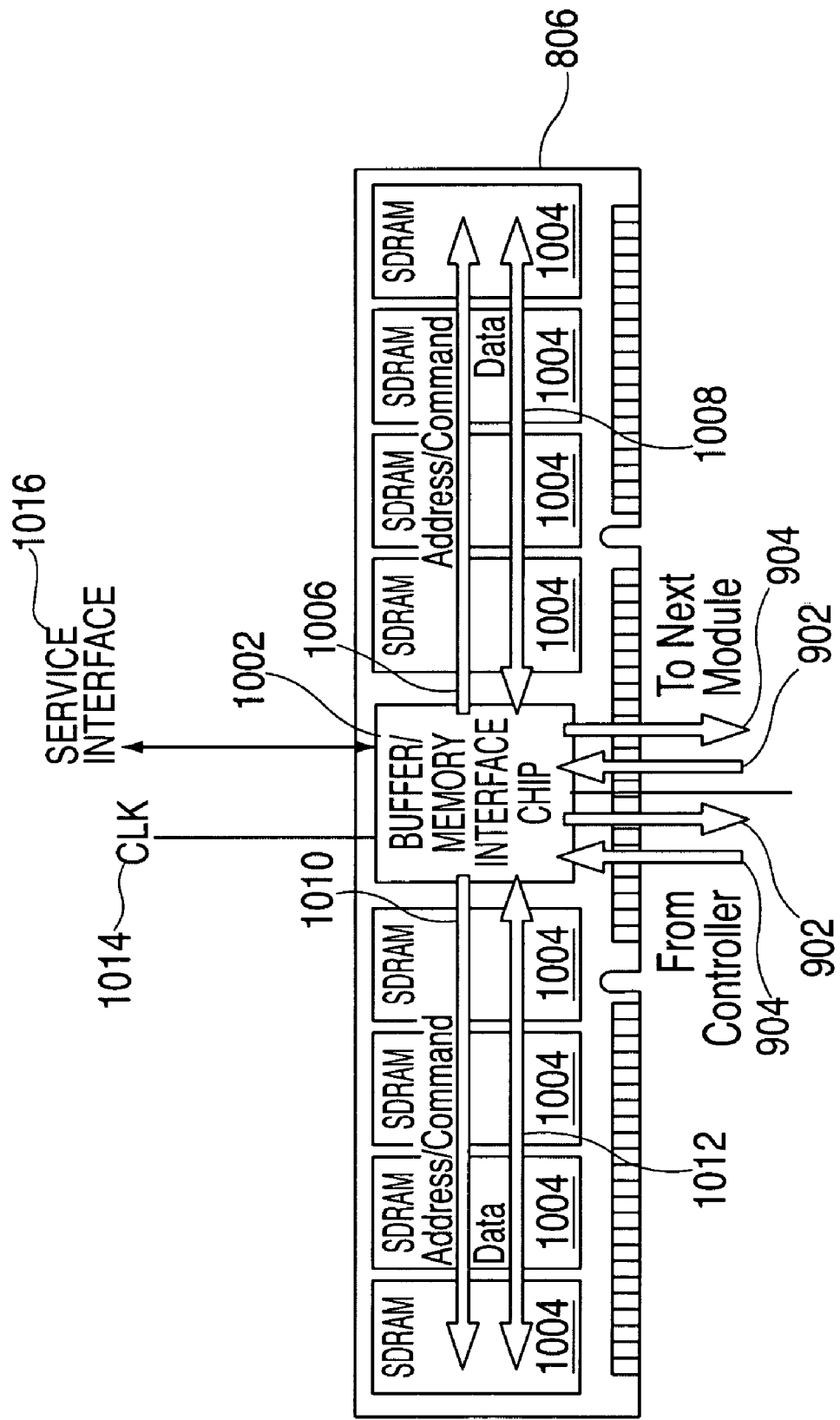
FIG. 10 depicts a buffered module wiring system that is utilized by exemplary embodiments of the present invention.

FIG. 10 depicts a buffered module wiring system that is utilized by exemplary embodiments of the present invention. FIG. 10 is a pictorial representation of a memory module, with shaded arrows representing the primary signal flows. The signal flows include the upstream memory bus 902, the downstream memory bus 904, memory device address and command busses 1010 and 1006, and memory device data busses 1012 and 1008. In an exemplary embodiment of the present invention, a buffer device 1002, also referred to as a memory interface chip, provides two copies of the address and command signals to the SDRAMs 1004 with the right memory device address and command bus 1006 exiting from the right side of the buffer device 1002 for the SDRAMs 1004 located to the right side and behind the buffer device 1002 on the right. The left memory device address and command bus 1010 exits from the left side of the buffer device 1002 and connects to the SDRAMs 1004 to the left side and behind the buffer device 1002 on the left. Similarly, the data bits intended for SDRAMs 1004 to the right of the buffer device 1002 exit from the right of the buffer device 1002 on the right memory device data bus 1008. The data bits intended for the left side of the buffer device 1002 exit from the left of the buffer device 1002 on a left memory device data bus 1012. The high speed upstream memory bus 902 and downstream memory bus 904 exit from the lower portion of the buffer device 1002, and connect to a memory controller or other memory modules either upstream or downstream of this memory module 806, depending on the application. The buffer device 1002 receives signals that are four times the memory module data rate and converts them into signals at the memory module data rate.

The memory controller 802 interfaces to the memory modules 806 via a pair of high speed busses (or channels). The downstream memory bus 904 (outbound from the memory controller 802) interface has twenty-four pins and the upstream memory bus 902 (inbound to the memory controller 802) interface has twenty-five pins. The high speed channels each include a clock pair (differential), a spare bit lane, ECC syndrome bits and the remainder of the bits pass information (based on the operation underway).

Due to the cascaded memory structure, all nets are point-to-point, allowing reliable high-speed communication that is independent of the number of memory modules 806 installed. Whenever memory module 806 receives a packet on either bus, it re-synchronizes the command to the internal clock and re-drives the command to the next memory module 806 in the chain (if one exists).

FIG. 10 also includes bi-directional signal, referred to as a service_interface signal 1016, into and out of the buffer device 1002. In addition, FIG. 10 depicts an alternate_reference_clock signal 1014 into the buffer device 1002. During self testing of the memory module 806, all signals needed to initiate and to perform the self test are provided to the memory module 806 by the service_interface signal 1016 and the alternate_reference_clock signal 1014. In exemplary embodiments of the present invention, the alternate_reference_clock signal 1014 is a phase lock loop (PLL) clock reference in the one hundred megahertz frequency range that can be produced by basic off the shelf test systems. The service_interface signal 1016 is a slow speed, simple protocol interface (e.g., in the range of 10 MHz) that the test system can drive with a test pattern generator. Any test system that can perform the test system functions described herein may be utilized by exemplary embodiments of the present invention. Examples of off the shelf test systems that may be utilized by exemplary embodiments of the present invention include the Versatest Series from Agilent and the PT100 from Intellitech.

Figure 11:
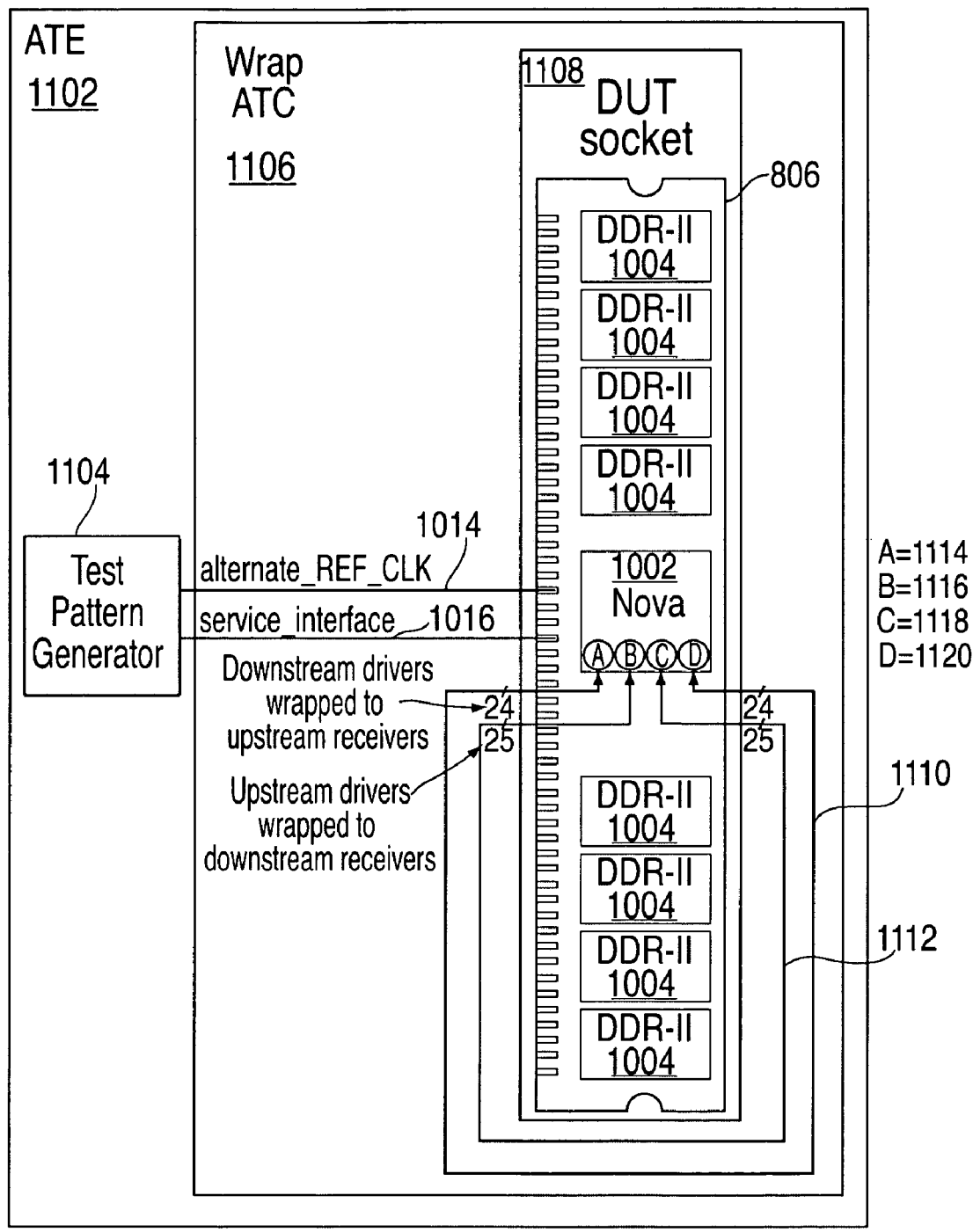
FIG. 11 depicts a test environment for a memory module that may be utilized by exemplary embodiments of the present invention.

FIG. 11 depicts a test environment for a memory module that may be utilized by exemplary embodiments of the present invention. Contained in the buffer device 1002 on the memory module 806 is the circuitry required to execute the high speed interface self test mode. Any self test method may be implemented via circuitry in the buffer device 1002. Such a self-test method would be included within the logic design of the buffer device and may be utilized to implement one or more of the functions described herein. The self-test mode within the buffer device 1002 provides the capability to transmit and to receive complex pulse trains over the various high speed digital links (also referred to herein as high speed serial interfaces) to fully exercise the links. The memory module 806 being tested is inserted into a device under test (DUT) socket 1108. The DUT socket 1108 resides on a test system interface board which is referred to in FIG. 11 as a wrap automated test card (ATC) 1106 The wrap ATC 1106 is connected to a test system such as a automated test equipment (ATE) 1102 system depicted in FIG. 11.

As discussed previously, the memory module 806 being tested drives a high speed upstream memory bus 902 and the high speed downstream memory bus 904 via two high speed digital link driver and receiver groups within the memory module 806. As shown in FIG. 11, the upstream group includes an upstream receiver 1114 for receiving signals from the downstream memory bus 904 and an upstream driver 1116 for driving signals onto the upstream memory bus 902. Also as shown in FIG. 11, the downstream group includes a downstream receiver 1118 for receiving signals from the upstream memory bus 902 and a downstream driver 1120 for driving signals onto the downstream memory bus 904.

On the wrap ATC 1106, printed circuit board wiring is included to wrap, or to connect, each of the drivers to the associated receivers. When the DUT is inserted into the DUT socket 1108, an upstream signal path 1112 is established from the twenty-five upstream driver 1116 output signals to the twenty-five downstream receiver 1118 input ports. This results in information/bits that would have been transferred from the memory module 806 to an upstream memory module 806 or memory controller 802, via the upstream memory bus 902 being input to the memory module 806 as information/bits received via the upstream memory bus 902. Similarly, a downstream signal path 1110 is established from the twenty-four downstream driver 1120 output signals to the twenty-four upstream receiver 1114 input ports. This result is that information/bits that would have been transferred from the memory module 806 to a downstream memory module 806 being input to the memory modules as information/bits received via the downstream memory bus 904.

Support signals from the ATE 1102 are provided to the buffer device 1002 to control test setup, execution and results processing. One of the support signals is the alternate_reference_clock signal 1014 which, as described previously, may be implemented by a PLL clock reference in the one hundred megahertz frequency range. The service_interface signal 1016, as described previously, may be implemented as a slow speed, simple protocol, interface which the ATE 1102 can drive with a test pattern generator.

Figure 12:
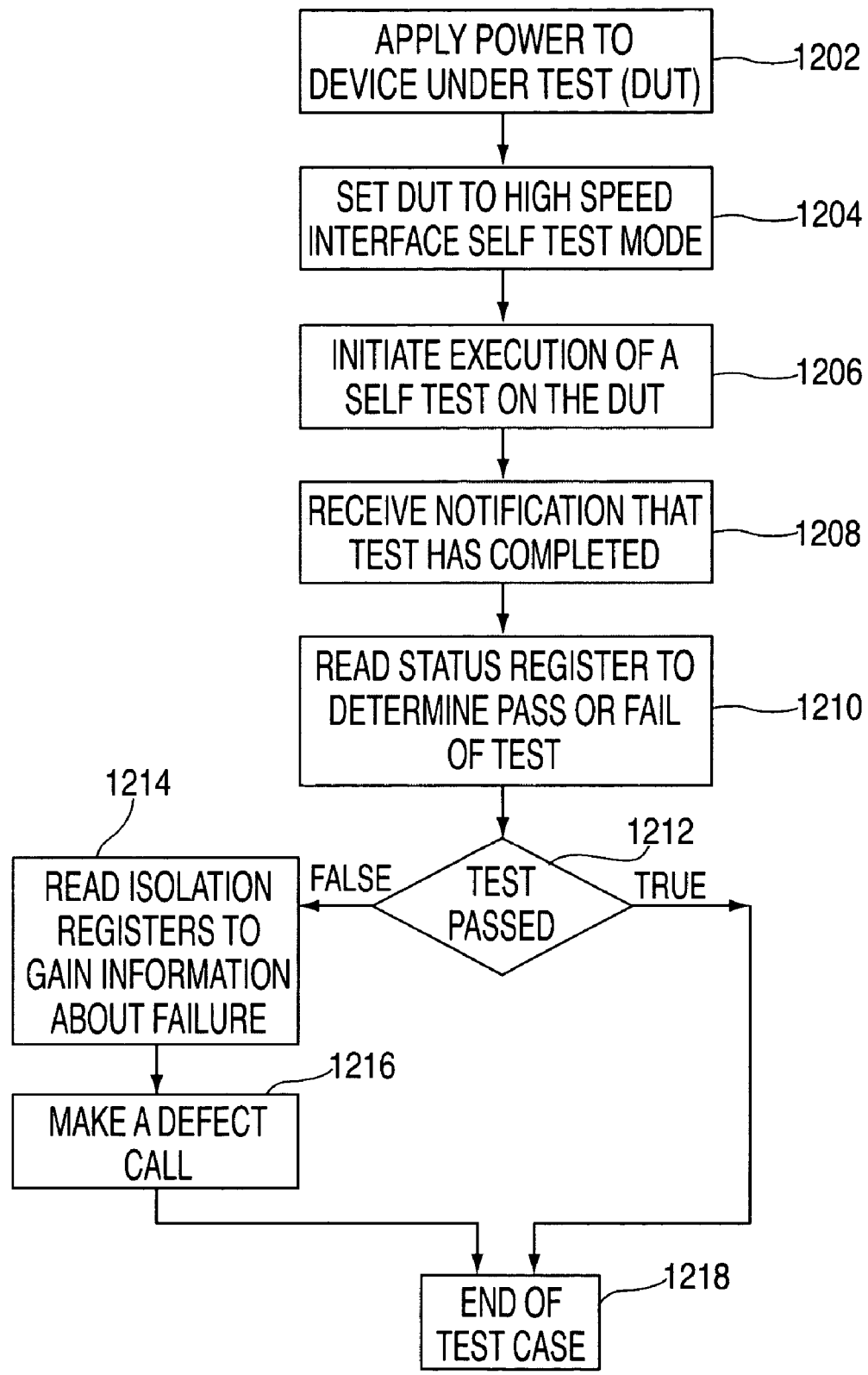
FIG. 12 is a process flow for testing a memory module in accordance with exemplary embodiments of the present invention.

FIG. 12 is a process flow for testing a memory module in accordance with exemplary embodiments of the present invention. Referring to FIG. 12, at step 1202, power is applied to the DUT (e.g., a memory module 806). At step 1204, the ATE 1102 issues commands (e.g., via the service_interface signal 1006) to the buffer device 1002 to configure the buffer device 1002 for a high speed interface self test mode. At step 1206, a "go" command is issued by the ATE 1102 (e.g., via the service_interface signal 1006) to the buffer device 1002 to execute the high speed interface self test. At step 1208, the ATE 1102 executes a wait loop while polling a status register on the buffer device 1002 to indicate the completion of the test. At step 1210, when the test has completed, status registers are read to ascertain a passing or failing result. If it is determined at step 1212, that the result is a pass, then processing continues at 1218 and the test case is completed. Alternatively, if it is determined at step 1214, that the result is a fail, then step 1214 is performed and the ATE 1102 reads fault isolation registers (e.g., via the service_interface signal 1006) to determine the signal or signals involved in the failure and to gain information relating to the type of defect that was detected. At step 1216, a defect type is determined. A defect type is provided to indicate one of a set of possible defects which was found. The defect type would exist for shorted or open circuit nets and for fails relating to a lack of switching speed ability.

Exemplary embodiments of the present invention may be utilized to test high speed serialized interfaces on a memory module using existing test devices. These existing test devices may operate at a slower speed than the serialized interfaces on the memory module. The test device initiates the test and interprets the test results via a third port on the memory module. By connecting the memory module output ports to memory module input ports, the test is performed at the speed of the memory module. In this manner, testing of the high speed memory modules described herein may be performed by utilizing existing test devices. Further, exemplary embodiments of the present invention allow testing to be performed after the memory module is fully assembled which may lead to test results that better reflect actual operating conditions.

As described above, the embodiments of the invention may be embodied in the form of computer-implemented processes and apparatuses for practicing those processes.

Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A method of testing a buffered memory module adapted for connection to a packetized cascaded interconnect memory subsystem, the method comprising:
    setting the memory module to a test mode, the setting including connecting an upstream driver on the memory module to a downstream receiver on the memory module and connecting a downstream driver on the memory module to an upstream receiver on the memory module;
    initiating a test on the memory module via a service interface signal, wherein input to the test includes signals generated by the upstream driver and the downstream driver;
    receiving notification when the test has completed; and
    determining the test results based on information retrieved from storage registers on the memory module.

2. The method of claim 1 wherein the memory module is inserted onto a test system interface board, the connection of the upstream driver to the downstream receiver is provided by the test system interface board and the connection of the downstream driver to the upstream receiver is provided by the test system interface board.

3. The method of claim 2 wherein the test system interface board operates at a slower speed than the memory module.

4. The method of claim 1 wherein the service interface signal is generated by a test pattern generator and includes a test pattern for use in the test.

5. The method of claim 4 wherein the test pattern generator operates at a slower speed than the memory module.

6. The method of claim 1 wherein the storage registers include a status register that indicates whether the test passed or failed and the determining the test results includes checking the status register.

7. The method of claim 6 wherein the storage registers further include an isolation register with information about the failure of the test if the status register indicates that the test failed.

8. The method of claim 1 wherein the storage registers include a test status register that indicates when the test has completed.

9. The method of claim 1 wherein the test is a self test.

10. The method of claim 1 wherein the test is a self test of the downstream driver, the downstream receiver, the upstream driver and the upstream receiver.

* * * * *